United States Patent
Ludwig et al.

(10) Patent No.: US 10,393,829 B2
(45) Date of Patent: Aug. 27, 2019

(54) METHOD AND DEVICE FOR POSITION DETERMINATION IN A MAGNETIC RESONANCE TOMOGRAPHY UNIT

(71) Applicants: Klaus Ludwig, Erlangen (DE); Volker Schnetter, Nürnberg (DE); Johann Sukkau, Herzogenaurach (DE); Andrew Dewdney, Neunkirchen am Brand (DE); Axel Heitland, Erlangen (DE); Ralf Ladebeck, Erlangen (DE); Ronny Pflichtbeil, Fürth (DE); Jörg Rothard, Litzendorf (DE); Volker Weißenberger, Möhrendorf (DE)

(72) Inventors: Klaus Ludwig, Erlangen (DE); Volker Schnetter, Nürnberg (DE); Johann Sukkau, Herzogenaurach (DE); Andrew Dewdney, Neunkirchen am Brand (DE); Axel Heitland, Erlangen (DE); Ralf Ladebeck, Erlangen (DE); Ronny Pflichtbeil, Fürth (DE); Jörg Rothard, Litzendorf (DE); Volker Weißenberger, Möhrendorf (DE)

(73) Assignee: Siemens Healthcare GmbH, Erlangen (DE)

( * ) Notice: Subject to any disclaimer, the term of this patent is extended or adjusted under 35 U.S.C. 154(b) by 181 days.

(21) Appl. No.: 15/445,276

(22) Filed: Feb. 28, 2017

(65) Prior Publication Data
US 2017/0248665 A1 Aug. 31, 2017

(30) Foreign Application Priority Data
Feb. 29, 2016 (DE) .................. 10 2016 203 255

(51) Int. Cl.
*G01R 33/30* (2006.01)
*G01R 33/3875* (2006.01)
(Continued)

(52) U.S. Cl.
CPC ......... *G01R 33/307* (2013.01); *G01R 33/243* (2013.01); *G01R 33/3415* (2013.01);
(Continued)

(58) Field of Classification Search
None
See application file for complete search history.

(56) References Cited

U.S. PATENT DOCUMENTS 5,565,891 A 10/1996 Armstrong
7,852,081 B2 * 12/2010 Arnold ............... G01R 33/3415
324/318
(Continued)

FOREIGN PATENT DOCUMENTS

DE 4409530 A1 10/1994
DE 10003712 C2 12/2002
(Continued)

*Primary Examiner* — Douglas X Rodriguez
(74) *Attorney, Agent, or Firm* — Lempia Summerfield Katz LLC

(57) ABSTRACT

A method for determining a position of a mobile device relative to a B0 field magnet along a z-coordinate axis, and a device and a magnetic resonance tomography unit for performing the method are provided. The device includes a magnetic field strength sensor arranged in a fixed relative position. A characteristic magnetic field strength $B_{ref}$ of the B0 field magnet that emerges for a plurality of x-y coordinate pairs with a same reference z-coordinate $z_{ref}$ is ascertained. The device is moved along the z-coordinate axis until the magnetic field strength sensor measures the characteristic magnetic field strength $B_{ref}$.

16 Claims, 3 Drawing Sheets

(51) Int. Cl.
    *G01R 33/44*    (2006.01)
    *G01R 33/48*    (2006.01)
    *G01R 33/24*    (2006.01)
    *G01R 33/3415*  (2006.01)

(52) U.S. Cl.
    CPC ....... *G01R 33/3875* (2013.01); *G01R 33/443* (2013.01); *G01R 33/481* (2013.01)

(56) References Cited

U.S. PATENT DOCUMENTS

| | | |
|---|---|---|
| 2002/0016696 A1 | 2/2002 | Rabe |
| 2006/0222314 A1 | 10/2006 | Zumbrunn et al. |
| 2009/0281419 A1 | 11/2009 | Troesken et al. |
| 2010/0072985 A1 | 3/2010 | Kess |
| 2010/0176800 A1 | 7/2010 | Biber et al. |
| 2010/0176809 A1* | 7/2010 | Biber ............... G01R 33/3692 324/309 |
| 2010/0272229 A1 | 10/2010 | Biber et al. |
| 2010/0289492 A1 | 11/2010 | Biber et al. |
| 2011/0221441 A1 | 9/2011 | Baumgartl et al. |
| 2013/0181715 A1 | 7/2013 | Biber |
| 2015/0102809 A1 | 4/2015 | Van Beek et al. |
| 2016/0178713 A1* | 6/2016 | Fischer ............. G01R 33/36 324/322 |

FOREIGN PATENT DOCUMENTS

| | | |
|---|---|---|
| DE | 102006029122 A1 | 12/2007 |
| DE | 102008048476 A1 | 4/2010 |
| DE | 102009004448 A1 | 7/2010 |
| DE | 102009021026 A1 | 11/2010 |
| DE | 102009018282 A1 | 12/2010 |
| DE | 102010010820 A1 | 9/2011 |
| DE | 102012200600 A1 | 7/2013 |
| DE | 102013214125 A1 | 4/2014 |
| DE | 102013220933 B3 | 1/2015 |
| EP | 1710602 B1 | 11/2012 |

* cited by examiner

METHOD AND DEVICE FOR POSITION DETERMINATION IN A MAGNETIC RESONANCE TOMOGRAPHY UNIT

This application claims the benefit of DE 10 2016 203 255.0, filed on Feb. 29, 2016, which is hereby incorporated by reference in its entirety.

BACKGROUND

The present embodiments relate to determining a position of a device on a z-coordinate axis relative to a B0 field magnet of a magnetic resonance tomography unit.

Magnetic resonance tomography units are imaging devices that, to map an object under examination, align the nuclear spin of the object under examination with a strong external magnetic field and stimulate precession around this alignment by an alternating magnetic field. The precession or return of the spin stimulated from this in a low-energy state generates an alternating magnetic field that is received via antennae as a response.

With the aid of magnetic gradient fields, spatial encoding is imprinted on the signals, which subsequently enables assignment from the received signal to a volume element. The received signal is then evaluated, and three-dimensional imaging of the object under examination is provided.

To receive the signal, local antennae (e.g., local coils) that are arranged directly on the object under examination may be used to obtain a better signal to noise ratio. Therefore, a position of the local coils with regard to the remaining magnetic resonance tomography unit (e.g., the B0 field magnet) is not firmly defined and is to be recorded separately. This relates, for example, to the position in the direction of the z-axis. The z-axis usually passes horizontally and centrally through the opening of the B0 field magnet as a symmetry axis. Along the z-axis, the object under examination is moved via a mobile patient couch into an area of a homogenous B0 field inside a patient tunnel by the B0 field magnet.

While the position of the object under examination in the x-coordinate axis and y-coordinate axis running orthogonally to the z-coordinate axis is relatively defined by the couch and is also covered by the homogenous B0 field at the center of the B0 field magnet, this may only ever cover a small area of the object under examination in the direction of the z-axis. It is therefore particularly important to record the z-coordinate of the local coil.

However, there are also applications in which a particularly high level of precision is to be provided in terms of alignment. For example, in a combined MRT-PET scan, the radiation produced by the positrons is attenuated by the local coil. To be able to compensate for this effect in evaluation, the position of the local coil is to be recorded as precisely as possible in the beam path in the magnetic resonance tomography unit (e.g., in all three coordinate axes).

For example, the projection of a model with which the local coil is aligned in the scanning area by a light source is known. This is difficult in the scanning area due to restricted accessibility. The local coil is to be arranged as close to the body as possible and is therefore possibly covered with heated blankets.

SUMMARY AND DESCRIPTION

The scope of the present invention is defined solely by the appended claims and is not affected to any degree by the statements within this summary The present embodiments may obviate one or more of the drawbacks or limitations in the related art. For example, position recording of a local coil and other mobile devices relative to a magnetic resonance tomography unit is improved.

The method according to one or more of the present embodiments determines a position of a mobile device relative to a B0 field magnet along a z-coordinate axis. The z-coordinate axis is defined as a symmetry axis of the B0 field magnet through a patient tunnel of the B0 field magnet in a preferred direction of the B0 field. The z-coordinate axis is horizontally aligned in the customary set-up of a magnetic resonance tomography unit and passes centrally through the opening of the windings of the B0 field magnet through a scanning area of the B0 field magnet. Usually, the object for scanning is brought into the scanning area parallel to the z-coordinate axis on a patient couch. The method uses a magnetic field strength sensor attached to the device in a fixed relative position. Together with the z-coordinate axis, an x-coordinate axis and a y-coordinate axis span an area, where the coordinate axes may be orthogonal to each other, and the x-coordinate axis is horizontally aligned and the y-coordinate axis is vertically aligned.

In an act of the method according to an embodiment, a characteristic magnetic field strength $B_{ref}$ of the B0 field magnet is ascertained. This characteristic magnetic field strength is characterized in that for a plurality of x-y coordinate pairs, the magnetic field strength assumes an essentially equal value for the same z-coordinate value, which is designated hereinafter as a reference z-coordinate $z_{ref}$. That the values of the magnetic field strength for different x-y coordinates with the same z-coordinate differ from each other by less than 15%, 5%, or 1% is described as essentially equal. A number of 3, 5, 10, 20 or more is described as a plurality here. The characteristic magnetic field strength $B_{ref}$ ranges between 20% and 80% of a maximum magnetic field strength of the B0 field magnet. The value therefore differs from the value at the center of the scanning area, at which the magnetic field strength is homogenously the maximum magnetic field strength for as large an x-y area as possible. Alternatively, the value differs from z-values far removed from the B0 field magnet, at which the magnetic field strength for many x-y-values is almost zero. The value for the characteristic magnetic field strength $B_{ref}$ may be ascertained most easily by arranging the magnetic field strength sensor at various x-y coordinates, varying the z-coordinate by the method and recording measured values of the magnetic field strength as a function of the z-coordinate in the process. The x-y coordinates may be selected such that, with a projection along the z-coordinate axis, the x-y coordinates come to lie within the scanning area. As the magnetic field of the B0 field magnet is usually rotationally symmetric to the z-coordinate axis, it is sufficient in each case to select x-y coordinate pairs at different distances to the z-coordinate axis. If the values of the magnetic field strength ascertained in this way are plotted as a function for different x-y coordinate pairs, respectively, the value for $B_{ref}$ and $z_{ref}$ is produced by the coordinates of the intersection point of the curves or the point at which the curves come closest to each other.

The amount of a projection on a direction or a plane or also the amount of the three-dimensional field vector may be the magnetic field strength.

In another act of the method, the device is moved along the z-coordinate axis until the magnetic field strength sensor measures the characteristic magnetic field strength $B_{ref}$. This is to be understood as a recorded measured value of the magnetic field strength sensor differing by less than a predetermined tolerance value (e.g., 5%, 1%, 0.1%) or a measurement inaccuracy of the magnetic field strength sensor from the characteristic magnetic field strength $B_{ref}$. The magnetic field strength sensor is then located on the reference z-coordinate $z_{ref}$. In one embodiment, the current z-coordinate is adopted as a reference point $z_{ref}$, and all further movements along the z-coordinate axis are performed relative to this reference point $z_{ref}$. The z-coordinate of the magnetic field strength sensor and the device are known in each case.

The method according to one or more of the present embodiments is based on the knowledge that the customary B0 field magnets have a field path in the direction of the z-coordinate, which assumes a constant or almost constant value for a predetermined distance over an area in an x-y direction. At the same time, the dependence of the magnetic field strength in the z-direction is high, resulting in the area with the magnetic field strength $B_{ref}$ being sharply defined in the z-direction and it being possible to determine the position of the z-coordinate $z_{ref}$ with great accuracy. The constancy of the magnetic field strength for $z_{ref}$ in the x-y direction permits the almost unlimited arrangement of the device with the magnetic field strength sensor on the object under examination without distorting the result for the z-coordinate. A reference value for the z-coordinate may thus be simply established, and subsequent movements may be based thereon.

The local coil according to one or more of the present embodiments has a magnetic field strength sensor and an orientation sensor that is arranged on the local coil. The magnetic field strength sensor is configured to record the amount and direction of a magnetic field vector. A system including several Hall effect sensors that are arranged such that the respective directions of maximum sensitivity span an area may be provided as a magnetic field strength sensor. The orientation sensor is configured to record a relative alignment of the orientation sensor to a predetermined spatial direction. One or more micromechanical sensors that record an angle of an internal reference axis and the direction of gravity may be provided, for example. However, sensors recording alignment with regard to an external signal source (e.g., one or more cameras and light sources as signal sources and reference points) may also be provided.

Advantageously, the local coil according to one or more of the present embodiments enables a reference to be created between the magnetic field direction and a spatial direction outright or with regard to the magnetic resonance tomography unit. Thus, for example, using the additional orientation information, a clear x-y coordinate pair may be obtained from a magnetic field measurement that only provides information about one position on a circle due to the rotational symmetry of the field.

The shim coil according to one or more of the present embodiments shares the advantages of the local coil.

The magnetic resonance tomography unit according to one or more of the present embodiments has a B0 field magnet, a device, a mobile patient couch, a control unit, and a storage unit. The device may, for example, be a local coil, but also a shim coil. A magnetic field strength sensor that is in signal connection with the control unit is arranged on the device. The patient couch is configured to be moved into a scanning area of the B0 field magnet by the control unit along a z-coordinate axis that is defined by a symmetry axis of the B0 field magnet in the preferred direction of the B0 field. A characteristic magnetic field strength $B_{ref}$ of the B0 field magnet in a range of between 20% and 80% of a maximum magnetic field strength of the B0 field magnet is stored in the storage unit. As a result, the magnetic resonance tomography unit is able to perform the method according to one or more of the present embodiments. In detail, the control unit is configured to move the patient couch along the z-coordinate axis and to record magnetic field strength values from the magnetic field strength sensor via the signal line and compare these with the characteristic magnetic field strength $B_{ref}$ until the difference between the recorded magnetic field strength values and the characteristic magnetic field strength $B_{ref}$ is smaller than a predetermined tolerance value.

The magnetic resonance tomography unit according to one or more of the present embodiments thus shares the advantages of the method.

In a further act of a possible embodiment of the method, the mobile device is moved along the z-coordinate axis by a position determination unit relative to the B0 field magnet by a predetermined distance.

While the method around the z-axis takes place at a predetermined distance, the z-coordinate is also precisely defined in an advantageous manner according to the method if the starting position was previously calibrated on the reference z-coordinate $z_{ref}$ using the method. After a one-off calibration, with precise knowledge of the z-position, the local coil may then be positioned as desired, as long as the local coil is not moved relative to the position determination unit or patient couch.

In an embodiment of the method, the magnetic field strength sensor has three sensor elements that record a field strength of three components of the B0 field in three directions spanning an area. In this way, the magnetic field vector may be determined, and the magnetic field strength sensor may ascertain the magnetic field strength as an amount of the vector. If the three spatial directions of the three sensor elements (e.g., three Hall elements) are orthogonally on top of each other, the magnetic field strength is produced by the root of the square sum of the measured signal values of the three sensor elements. For non-orthogonal alignment, the amount is produced by a prior transformation (e.g., a matrix multiplication of the vector).

The recording of the magnetic field strength via the components of the vector enables a precise determination of the magnetic field strength independent of the alignment of the magnetic field strength sensor. In one embodiment, information about x-y coordinates of the magnetic field strength sensor may also be determined through the direction of the magnetic field in connection with information from the orientation sensor on alignment in the area.

In a possible embodiment of the method, the method also has the act of ascertaining $B_{xy}$-z curves of a dependence of the magnetic field strength from the z-coordinate for the majority of x-y coordinate pairs, where the x-y coordinate pairs indicate points at different distances from the z-coordinate axis. The act may, for example, be performed by the magnetic field strength sensor being arranged in a fixed position on the patient couch and then the patient couch being moved in the z-direction. At the same time, the magnetic field strength and the z-position for different positions along the z-coordinate axis are recorded. The act is then repeated with other x-y coordinates for the arrangement of the magnetic field strength sensor. Usually, the magnetic field of a B0 field magnet is rotationally symmetric to the z-coordinate axis due to the arrangement of the coils so that it therefore suffices only to measure x-y coordinate pairs at different distances from the z-coordinate axis.

In another act, the magnetic field strength sensor with unknown x-y coordinates is moved parallel to the z-coordinate axis, and the magnetic field strength for different z-coordinates is recorded.

In a further act, for example, a curve is selected by the control unit from the ascertained $B_{xy}$-z curves most closely corresponding to the magnetic field strength values for the unknown x-y coordinates (e.g., by an error minimization method such as Least Mean Square (LMS).

In another act, a z-coordinate of the magnetic field strength sensor and the device connected to the magnetic field strength sensor in a fixed relative arrangement (e.g., the local coil) is determined by the selected $B_{xy}$-z curve and a measured magnetic field strength value. An inverse function of the $B_{xy}$-z curve or an interpolation method, for example, may be provided for the definition of the z-coordinates.

The path of the $B_{xy}$-z curves differs for z-coordinate values unequal $z_{ref}$ considerably. However, if only a suitable $B_{xy}$-z curve corresponding to the distance of the magnetic field strength sensor from the z-coordinate axis is selected using the error minimization method, different z-coordinates of the z-coordinate value may be advantageously determined directly from the magnetic field strength. In one embodiment, the coordinate $z_{ref}$ may be determined with greater accuracy, as the $B_{xy}$-z curve may possibly not intersect at precisely one point at $z_{ref}$. The choice of the $B_{xy}$-z curve also makes a point about the x-y coordinate or the distance of the magnetic field strength sensor from the z-coordinate axis.

In one embodiment of the method, the magnetic field strength sensor measures the characteristic magnetic field strength $B_{ref}$ if the measured magnetic field strength value differs by less than 10, 5, 2 or 1 percent of the characteristic magnetic field strength $B_{ref}$. In other words, the measurement of the magnetic field strength contains an error and the value $B_{ref}$ is deemed measured if the measured value falls within an interval of, for example, 10%, 5%, 2% or 1% of the value $B_{ref}$.

The course of the magnetic field strength displays a sharp increase by the value $B_{ref}$, so that even with a deviation or measurement inaccuracy of $B_{ref}$ by 10%, 5%, 2% or 1%, for example, the reference z-coordinate $z_{ref}$ may be ascertained with a minor deviation of less than a centimeter or a few millimeters.

In a possible embodiment of the method, the device also includes an orientation sensor in predetermined alignment with the magnetic field strength sensor so that there is fixed alignment between the magnetic field strength sensor and the orientation sensor. From the alignment established by the orientation sensor, the alignment of the magnetic field strength sensor may also be ascertained. The orientation sensor is configured to ascertain the relative alignment with the B0 field magnet. This may, for example, take place through the orientation sensor being able to record the direction of the gravitational field and the field magnet being positioned in a predetermined direction (e.g., vertically). However, one or more markings may be arranged on the field magnet (e.g., light sources) that are recorded by the orientation sensor (e.g., by a camera), and the alignment of the orientation sensor is determined by this. In a further act of the method, a relative alignment of the magnetic field strength sensor to the B0 field magnet is ascertained by the orientation sensor (e.g., by the orientation sensor ascertaining the relative alignment to the field magnet and from the relative alignment of the orientation sensor to the magnetic field strength sensor) concluding the relative alignment of the magnetic field strength sensor to the field magnet.

In another act of the method, an x-y coordinate pair is determined as a function of a selected $B_{xy}$-z-curve, the ascertained z-coordinate, and the ascertained relative alignment. The selected $B_{xy}$-z curve and the ascertained z-coordinate already produce values for the position along the z-axis and a distance from the z-coordinate axis. The ambiguity of the distance vector may then be resolved by the relative alignment of the magnetic field strength sensor to the field magnet ascertained by the orientation sensor so that a clear x-y coordinate pair is ascertained from the value for the distance from the z-coordinate axis.

A set of coordinates x, y and z for the magnetic field strength sensor and therefore also for the device may thus be advantageously determined with the aid of the additional orientation sensor. Depending on the embodiment of the orientation sensor, the method is also regardless of the optical view and may also be performed with the device covered.

In a possible embodiment of the method, the field magnet encloses a patient tunnel. The reference z-coordinate $z_{ref}$ is arranged outside the patient tunnel with regard to the z-coordinate axis.

In an advantageous manner, the reference z-coordinate $z_{ref}$ is outside the patient tunnel, enabling calibration of the z-coordinates to already take place before entering the patient tunnel, as long as the device is still easily accessible and may be moved. Outside the patient tunnel, the magnetic field strength and the $B_{xy}$-z curve fall away sharply so that even if the inaccuracy of magnetic field strength measurement is greater, the reference z-coordinate $z_{ref}$ may be determined sufficiently accurately.

In a possible embodiment of the method, the device is a local coil.

Local coils are arranged on the patient in order to be at the least possible distance and thus provide a better signal-to-noise ratio. In one embodiment, several antenna coils may be arranged in a local coil (e.g., in a matrix), permitting parallel imaging for several areas and thus accelerating image capture. As the position of the local coil is not determined by the design, however, before imaging, the position of the local coil is first determined with regard to the field magnet in the z-coordinate alone or also in all three spatial coordinates to then be able to position the local coil in the isocenter of the field magnet and to assign individual antenna coils to individual image areas. The method according to one or more of the present embodiments achieves this in an advantageous manner.

In a possible embodiment of the method, the device also has a shim coil. In a further act of the method, a current is set through the shim coil as a function of a magnetic field strength value recorded by the magnetic field strength sensor.

The B0 field of a field magnet has inhomogeneities that may produce image artifacts. Such inhomogeneities may be caused by the design of the field magnet. But the patient himself or herself also causes such distortions as a result of different magnetic susceptibility, for example, of the body and the ambient air in the proximity of the body surface, for example, on the nape or on the limbs. The effects may be at least partially compensated by additional magnetic fields produced by shim coils. The location and the orientation of the shim coil are to be known in order to determine the necessary current. The method according to one or more of the present embodiments advantageously enables the z-coordinate and, if necessary, also the other coordinates and the orientation of the shim coil to be ascertained with great accuracy if this is part of the device.

In a possible embodiment of the method, in a further act, a correction of a my-Map in MR-PET takes place as a function of a magnetic field strength value recorded by the magnetic field strength sensor.

In an MR-PET, two imaging examination methods are combined. Magnetic resonance tomography records the entire body of the patient or a part thereof and maps organs of the body. In positron emission tomography (PET), a radioactive material that displays positron decay is introduced into the body for examination. For example, $^{18}$F-fluorodeoxyglucose is enriched in the body, where there is a high metabolism. The positron produced by decay decays in reaction with an electron of the environment in two gamma quanta that move in opposite directions from each other. Using direction-sensitive gamma detectors and coincidence meters, the place of origin of the gamma quanta and thus, the place of enrichment of the radioactive material may be determined, which is then depicted in the image display of the magnetic resonance tomography and thus enables the corresponding organ to be identified.

Gamma quanta are absorbed or scattered by materials with a high atomic number, for example. A local coil, for example, has copper in the antenna coils and conductor tracks, resulting in the local coil distorting the image of the PET. Knowing the precise location of the local coil, however, effect of the local coil may be corrected by multiplication with inverse attenuation coefficients when evaluating the PET scan. The method according to one or more of the present embodiments permits this advantageously by precise determination of the z-coordinate and/or the x-y coordinate of the local coil and corresponding orientation.

The local coil and the magnetic resonance tomography unit according to one or more of the present embodiments for performance of the method share advantages.

DETAILED DESCRIPTION

Figure 1:
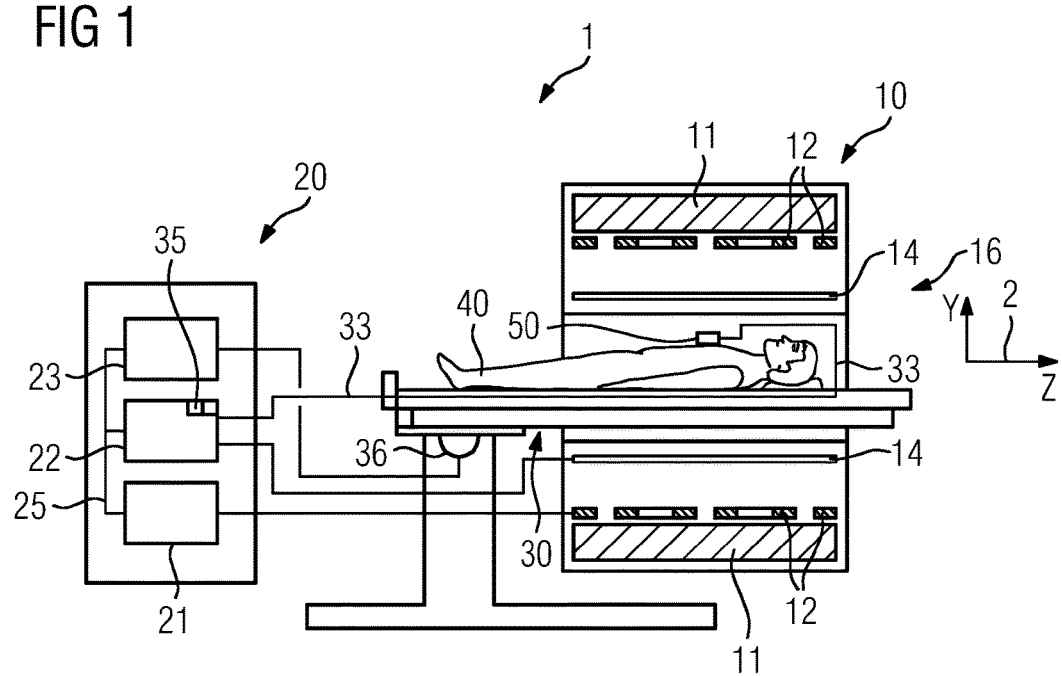
FIG. 1 shows an exemplary diagrammatic view of a magnetic resonance tomography unit with a device.

FIG. 1 shows a diagrammatic view of one embodiment of a magnetic resonance tomography unit 1 with a local coil 50 according to one or more of the present embodiments.

The magnetic unit 10 includes a field magnet 11 that produces a static magnetic field B0 for alignment of nuclear spin of samples or patients 40 in a scanning area. The scanning area is arranged in a patient tunnel 16 that extends in a longitudinal direction 2 through the magnetic unit 10. Usually, the field magnet 11 is a superconducting magnet that may provide magnetic fields with a magnetic flux density of up to 3T, in the case of the latest devices, even more. For lower field strengths, however, permanent magnets or electromagnets with normally conducting coils may also be used.

The magnetic unit 10 also includes gradient coils 12 that are configured to overlay the variable magnetic fields in three spatial directions over the magnetic field B0 to spatially differentiate the captured display ranges in the examination volume. The gradient coils 12 may be coils including normally conducting wires that may produce orthogonal fields to each other in the examination volume.

The magnetic unit 10 also includes a body coil 14 that is configured to emit a high-frequency signal supplied via a signal line, into the examination volume. The body coil 14 is also configured to receive resonance signals emitted by the patient 40 and to emit these via a signal line. However, replacement of the body coil 14 with local coils 50 that are arranged in the patient tunnel 16 close to the patient 40 for sending and/or receiving the high-frequency signal may be provided. In one embodiment, however, the local coil 50 is configured for sending and receiving, and a body coil 14 may therefore be omitted.

A control unit 20 (e.g., a controller) supplies the magnetic unit 10 with the various signals for the gradient coils 12 and the body coil 14 and evaluates the received signals.

The controller 20 therefore has gradient activation 21 that is configured to supply the gradient coils 12 with variable currents that provide the desired gradient fields in the examination volume in a chronologically coordinated fashion via supply lines.

The controller 20 includes a high-frequency unit 22 configured to produce a high frequency pulse with a predetermined chronological sequence, amplitude, and spectral power distribution for the excitation of the magnetic resonance of the nuclear spin in the patient 40. Pulse power in the range of kilowatts may be achieved in the process.

The magnetic resonance tomography unit 1 includes a local device that may be arranged on the patient (e.g., in the exemplary embodiment shown, the local coil 50). The local coil 50 is configured to receive magnetic resonance signals of excited nuclear spin and to transmit the magnetic resonance signals to the controller 20 via the signal connection 33, for a local coil 50, inter alia, to the high-frequency unit 22. Details of the device or local coil 50 are shown in FIG. 3.

Figure 2:
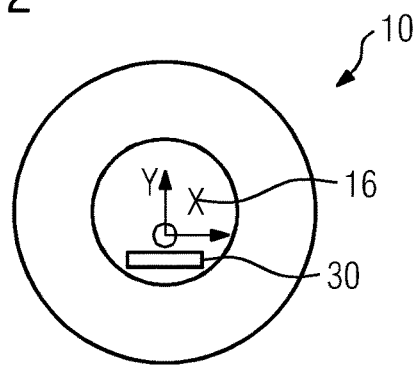
FIG. 2 shows a diagrammatic cross section through a field magnet of a magnetic resonance tomography unit according to an embodiment.

In FIG. 1, the coordinate axes, which are used hereinafter, are also shown. The designations x, y and z are selected at random. The z-coordinate axis runs centrally through the patient tunnel 16 and simultaneously provides a symmetry axis for the magnetic unit 10 and the field magnet 11 that, as shown in the cross section in FIG. 2, has an almost cylindrical form that is symmetrical to an axis of rotation at the center. The y-coordinate axis is arranged perpendicularly to the z-axis and vertically upwards on the plane of the drawing in FIG. 1. Only shown in the cross section of FIG. 2, the x-coordinate axis is arranged perpendicularly both to the z-coordinate axis and to the y-coordinate axis. Due to the rotational symmetry of the field magnet 11, the x-y coordinate axes may be freely rotated around the z-coordinate axis without the following description changing.

Figure 3:
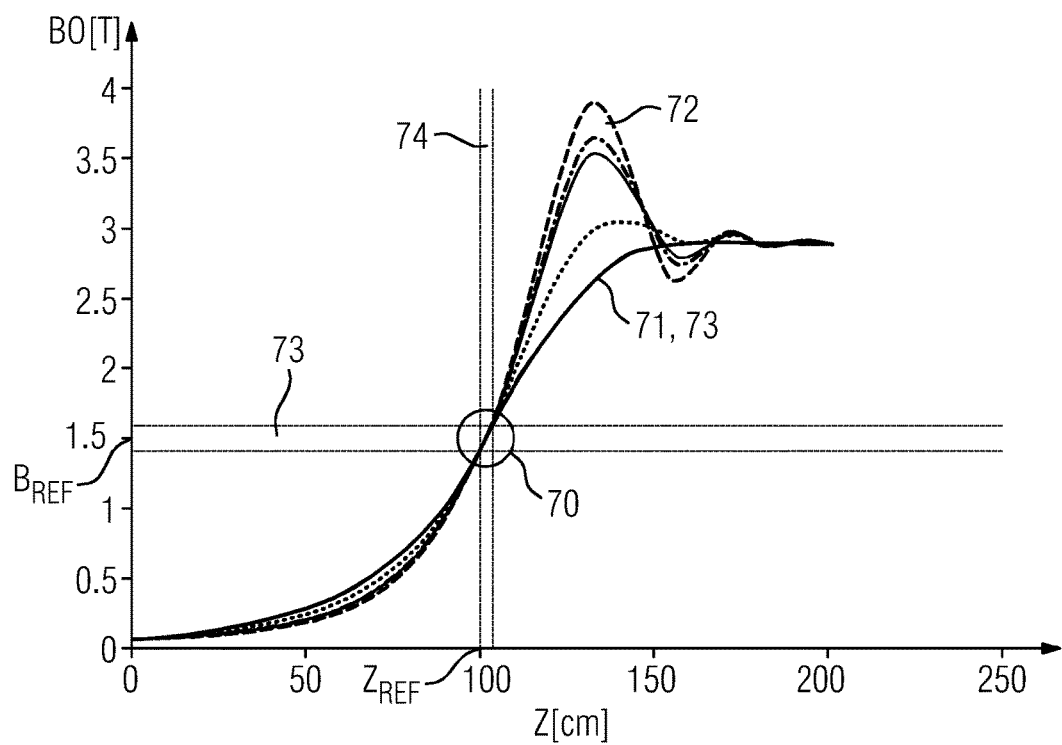
FIG. 3 shows a depiction of exemplary functions of the magnetic field strength of a field magnet as a function of the z-coordinate for different x-y coordinates.

FIG. 3 specifies the paths of the magnetic field strength B0 measured by a magnetic field strength sensor 60 as a function of the z-coordinate. The zero point is located 200 cm before the isocenter of the B0 field magnet on the z-coordinate axis. Curves with different x-y coordinates or distances to the z-coordinate axis are specified. As described below regarding the method, such curves of the B0 field magnet may be measured by moving the magnetic field strength sensor 60 with the same orientation and a fixed x-y coordinate along the z-coordinate axis through the B0 field and the measured values for magnetic field strength and z being recorded in the process.

In doing so, the curve 71 is directly assigned to the z-coordinate axis (x=0, y=0) with a magnetic field strength sensor, while the curve 72 corresponds to a path at the greatest distance from the z-coordinate axis. One or more of the present embodiments are based, inter alia, on the knowledge that the curves for a plurality of x-y coordinates at different distances from the z-coordinate axis intersect or come close to each other at an intersection 70. The intersection 70 is at a value $B_{ref}$ of the magnetic field strength, which for the 3T magnet shown, is approximately 50% of the magnetic field strength $B0_{iso}$ at the isocenter. This may vary (e.g., the value may lie within an interval of between 20% and 80% of the magnetic field strength in the isocenter).

The curve paths have a high gradient around the point of intersection ($z_{ref}$, $B_{ref}$), which distinguishes this point, for example, from the curve paths at z=0 or z=200. For example, a value of the gradient greater than $0.2*B0_{iso}$ divided by the length of the B0 field magnet in a z-direction may be considered a high gradient.

Even with erroneous measurement of the magnetic field strength indicated by the horizontal bar 73 around the value $B_{ref}$, the high gradient enables the reference z-coordinate $z_{ref}$ to be determined with great accuracy, indicated by the narrow vertical bar 74.

Figure 4:
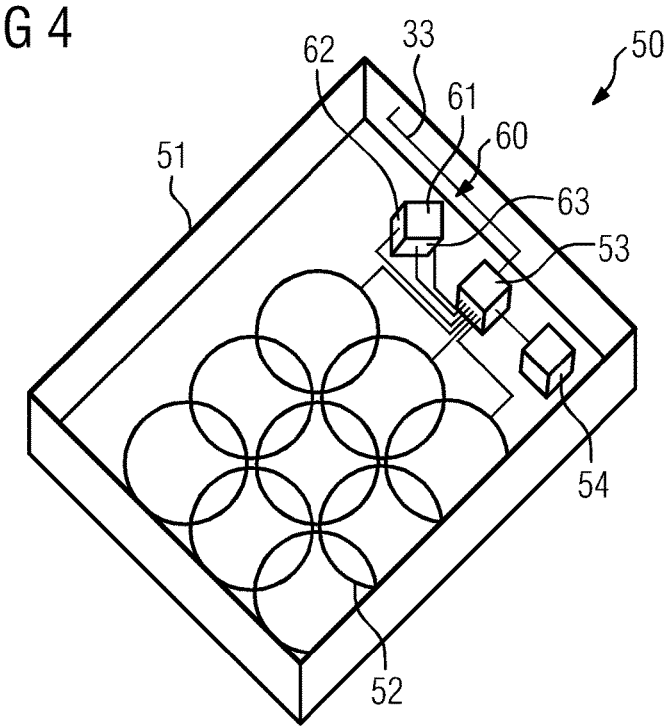
FIG. 4 shows a diagrammatic view of a local coil according to an embodiment.

FIG. 4 shows an exemplary embodiment of a device (e.g., a local coil 50). The local coil 50 includes one or more antenna coils 52 in a housing 51.

In the local coil 50, there is a magnetic field strength sensor 60 that is configured to measure a magnetic field strength. In one embodiment, the magnetic field strength sensor 60 includes three sensor elements 61, 62, 63 that each records the strength of a spatial component of the magnetic field vector (e.g., Hall elements). The sensor elements 61, 62, 63 are arranged such that the three Spatial components span a three-dimensional area. For example, the sensor element 62 may be arranged perpendicularly to the sensor element 61 and both in turn perpendicularly to the sensor element 63. The amount may then be ascertained from the three components of the vector, for example, with a perpendicular arrangement of the sensor elements to each other by forming the root from the sum of the squares of the components. This may be done either by signal processing 53 in the local coil 50 and transmission of the result by signal processing 53 to the control unit 20, or signal processing 53 transmitting the measured values of the sensor elements 61, 62, 63 via the signal connection 33 to the controller 20 for calculation. However, the magnetic field strength sensor 60 may be configured to ascertain the amount of magnetic field strength directly, for example, via the nuclear magnetic resonance of a test material, comparable to a field probe.

In the embodiment shown in FIG. 4, the local coil 50 also includes an orientation sensor 54. The orientation sensor 54 is configured to ascertain alignment with regard to the field magnet 11. For example, a sensor that determines the direction of gravity, for example, of a test mass, by mechanical devices may be involved. As the alignment of the field magnet 11 with the force of gravity is known, two angles of the orientation sensor 54 and thus the local coil 50 may also be ascertained with regard to the field magnet 11. A third angle may be determined, for example, with reference to the preferred direction of the magnetic field at the isocenter or on the z-coordinate axis. Such orientation sensors are, for example, micromechanically available in silicon technology (MEMS).

However, in one embodiment, the orientation sensor 54 includes a camera and ascertains the orientation of optical features of the magnetic unit 10 (e.g., markings or light sources on the housing). The camera may also conversely be arranged on the magnetic unit and corresponding markers on the local coil 50.

If the orientation in several axes is already known, for example, by a fixed arrangement of the local coil 50 on a patient couch, or if lower precision of the z-coordinate is sufficient, the orientation sensor 54 may also be omitted.

In one embodiment, the device is not a local coil 50, as shown in FIG. 4, but is a shim coil, for which instead of the antenna coils 52, there are one or more coils for the production of a compensation field for interferences in the B0-magnetic field. The other components of the device are then as described in FIG. 4. This applies to all possible devices in connection with a magnetic resonance tomography unit 1 for which precise position determination is to be provided, at least in the z-coordinate.

Figure 5:
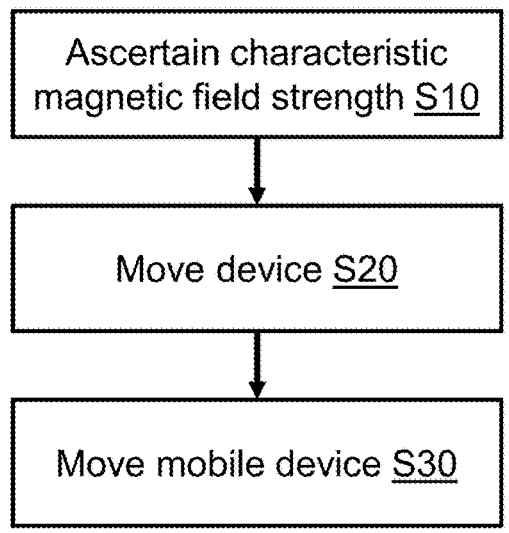
FIG. 5 shows a diagrammatic flow chart of one embodiment of a method.

FIG. 5 shows a diagrammatic flow chart of one embodiment of a method.

In act S10, a characteristic magnetic field strength $B_{ref}$ of the B0 field magnet is ascertained. The characteristic magnetic field strength $B_{ref}$ is characterized in that, as shown in FIG. 3, a value of the magnetic field strength $B_{ref}$ emerges as a result of a magnetic field strength sensor 60 for the majority of x-y coordinate pairs with the same reference z-coordinate $z_{ref}$. As aforementioned in FIG. 3, the characteristic magnetic field strength $B_{ref}$ lies in the range of between 20% and 80% of a maximum magnetic field strength of the B0 field magnet and consequently differs from the magnetic field strength for large distances from the field magnet 11, which approaches zero or the magnetic field strength at the isocenter, which approaches 100% of $B0_{iso}$.

Ascertainment may, for example, be performed by the controller 20, which moves a magnetic field strength sensor 60 arranged at different x-y coordinates by the patient couch 30 parallel to the z-coordinate axis. In doing so, the magnetic field strength sensor 60 records a curve for each x-y coordinate pair. The x-y coordinate pairs are at different distances from the z-coordinate axis. The intersection 70 at which all the curves intersect indicates the pair of values $z_{ref}$, $B_{ref}$ to the controller 20. In one embodiment, the act S10 is performed once for each magnetic unit 10, is ascertained for all the magnetic units 10 of the same type, or is repeated for a magnetic unit 10 after changes to the operating parameters or the environment. The value $B_{ref}$ or the pair of values $z_{ref}$, $B_{ref}$ may be stored in the controller 20.

In one embodiment, in act S10, the controller 20 calculates the $B_{xy}(z)$ curves for the magnetic unit 10 as a function of current operating parameters (e.g., the superconducting current) by a numerical approximation method and determines the pair of values $z_{ref}$, $B_{ref}$ from the point of intersection of the curves.

In act S20 of the method, the controller 20 moves the device using the position determination unit 36 of the patient couch 30 (e.g., the local coil 50) along the z-coordinate axis until, with the aid of the magnetic field strength sensor 60, the controller 20 measures a magnetic field strength that is essentially similar to the characteristic magnetic field strength $B_{ref}$ (e.g., differs by less than 15%, 5% or 1% from $B_{ref}$). The z-coordinate on which the patient couch 30 is located at this time is stored in a storage unit 35 in the control unit 20 as a reference z-coordinate $z_{ref}$.

In act S30 of the method, the mobile device is moved a predetermined distance along the z-coordinate axis by a position determination unit 36 relative to the B0 field magnet. The z-coordinate of the magnetic field strength sensor 60 and the device or local coil 50 with regard to the field magnet 11 is then determined by the reference z-coordinate $z_{ref}$ plus the predetermined distance. This is executed by a z-movement of the patient couch 30 by the control unit 20 using the position determination unit 36.

The method shown in FIG. 5 is suitable if only the z-coordinate axis is to be calibrated with regard to the isocenter of the field magnet 10, and the coordinates x and y of the magnetic field strength sensor 60 and the device are irrelevant.

Figure 6:
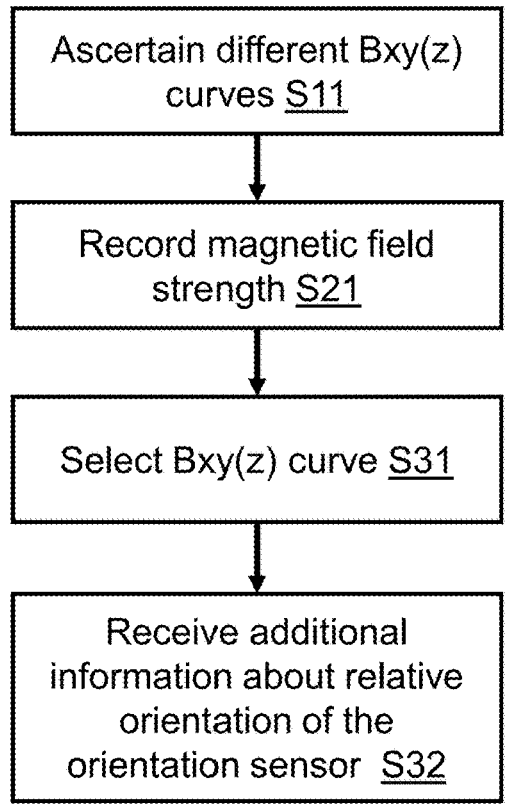
FIG. 6 shows a diagrammatic flow chart of a method according to an embodiment.

FIG. 6 shows a diagrammatic flow chart of a further possible embodiment of the method. The method of FIG. 6 enables still more coordinates of the magnetic field strength sensor 60 and the device to be established.

In act S11, first different $B_{xy}(z)$ curves (e.g., B(z) curves for different x-y coordinates) are ascertained. Ascertainment may also take place by a controller 20 that moves a magnetic field strength sensor arranged at different x-y coordinates using the patient couch 30 parallel to the z-coordinate axis. In the process, the magnetic field strength sensor records a curve for each x-y coordinate pair. Due to the rotational symmetry of the field magnet, the x-y coordinate pairs are each at different distances from the z-coordinate axis. The intersection 70, at which all the curves intersect, indicates, as aforementioned, indicates the pair of values $z_{ref}$, $B_{ref}$ to the controller 20. The act S11 may also be performed once for each magnetic unit 10, ascertained for all magnetic units 10 of the same type, or may be repeated for a magnetic unit 10 after changes to operating parameters or the environment, respectively. The $B_{xy}(z)$ curves recorded in act S11 are stored in the storage unit 35 in the controller 20.

In act S21, magnetic field strength values are then recorded for different positions along the z-coordinate axis with constant x-y coordinate by the magnetic field strength sensor 60. For example, the local coil 50 is positioned on the patient 40 with the magnetic field strength sensor 60, as a result of which an x-y coordinate is predetermined for the magnetic field strength sensor 60 but not yet recorded as a coordinate pair. The patient 40 is then moved with the local coil 50 in an unchanged position by the controller 20 on the patient couch 30 along the z-coordinate axis, and the magnetic field strength is recorded by the magnetic field strength sensor 60 in the process.

In act S31, a $B_{xy}$-z curve is selected by the controller 20 from the $B_{xy}$-z curves in act S11 with the aid of the magnetic field strength values ascertained in act S21 using an error minimization method. The error minimization method thus selects the curve from the curve stored in act S10 that most closely resembles the current curve path. For example, Least Mean Square (LMS) may be applicable here. In one embodiment, a $B_{xy}$-z curve for the current x-y coordinates is determined in act S31 through interpolation of the nearest $B_{xy}$-z curves stored. With the aid of the measured values recorded during movement in a z-direction in the course of act S21, the relative position may be determined in a z-coordinate direction to the isocenter of the field magnet by fitting the measured values to the selected $B_{xy}$-z curves and determining a corresponding z-coordinate in the sense of an inverse function from the currently measured magnetic field strength value B.

In one embodiment, a $z_{ref}$ is determined by the value $B_{ref}$ as in the method in FIG. 5. On account of the known path of the selected $B_{xy}$-z curve, however, the vertical bar 74 and the horizontal bar 73 in FIG. 3 may be reduced, enabling $z_{ref}$ to be determined with greater accuracy (e.g., having a tolerance of less than one millimeter).

Information about the distance of the magnetic field strength sensor 60 from the z-coordinate axis is also linked to the choice of $B_{xy}$-z curves. Clear x-y coordinates or the angle of a polar coordinate system around the z-coordinate axis may not be ascertained without additional parameters.

In an extended embodiment of the method in FIG. 6, in act S32, the controller 20 receives additional information about the relative orientation of the orientation sensor 54 to the magnetic unit 10 via signal processing 53 and the signal connection 33. For example, the orientation sensor 54 may specify information about the alignment of the orientation sensor 54 to the vertical, which is given by the direction of gravity. In connection with the direction of the B0 field, which runs in the z-direction at the isocenter and on the z-coordinate axis, the controller 20 ascertains the alignment of the magnetic field strength sensor from the additional three orientation parameters and consequently also the x and y coordinates from the distance from the z-coordinate axis. This enables the precise position and alignment of the local coil 50 to be determined using the magnetic field strength sensor 60 and the orientation sensor 54.

If some parameters are already known (e.g., the y-coordinate and the alignment to the vertical), when the local coil is arranged on or in the patient couch, the orientation sensor 54 may be simplified or omitted completely, and the position nonetheless determined in full. Alternatively, using all the parameters, a method for error minimization that improves the accuracy of position determination may be used.

Although the invention was illustrated and described in more detail by the exemplary embodiments, the invention is not limited by the disclosed examples. Other variations may be derived by a person skilled in the art without departing from the scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a position of a mobile device relative to a B0 field magnet along a z-coordinate axis that is defined by a symmetry axis of the B0 field magnet in a preferred direction of a B0 field, by a magnetic field strength sensor arranged in a fixed relative position on the mobile device, the method comprising:

ascertaining a characteristic magnetic field strength $B_{ref}$ of the B0 field magnet that emerges for a plurality of x-y coordinate pairs at different distances from the z-coordinate axis having essentially a same reference z-coordinate $z_{f}$, wherein the characteristic magnetic field strength $B_{ref}$ lies in a range of between 20% and 80% of a magnetic field strength of the B0 field magnet at an isocenter;

moving the mobile device along the z-coordinate axis until the magnetic field strength sensor measures the characteristic magnetic field strength $B_{ref}$;

ascertaining $B_{xy}$-z curves of a dependence of the magnetic field strength on a z-coordinate for a majority of x-y coordinate pairs, wherein the x-y-coordinate pairs indicate points at different distances from the z-coordinate axis;

recording a majority of magnetic field strength values using the magnetic field strength sensor for different positions along the z-coordinate axis with constant x-y coordinates;

selecting a $B_{xy}$-z curve with the aid of the ascertained magnetic field strength values by an error minimization method; and determining the z-coordinate using the selected $B_{xy}$-z curve and a measured magnetic field strength value.

2. The method of claim 1, wherein the mobile device is moved along the z-coordinate axis by a predetermined distance by a position determination unit relative to the B0 field magnet.

3. The method of claim 2, wherein the magnetic field strength sensor includes three sensor elements that record a field strength of three components of the B0 field in three directions that span an area, and the magnetic field strength sensor ascertains the magnetic field strength as an amount of a B0-field vector determined by three components of the B0 field.

4. The method of claim 2, wherein the magnetic field strength sensor measures the characteristic magnetic field strength $B_{ref}$ when the measured magnetic field strength value differs by less than 10 percent from the characteristic magnetic field strength $B_{ref}$.

5. The method of claim 1, wherein the magnetic field strength sensor includes three sensor elements that record a field strength of three components of the B0 field in three directions that span an area, and the magnetic field strength sensor ascertains the magnetic field strength as an amount of a B0-field vector determined by three components of the B0 field.

6. The method of claim 1, wherein the magnetic field strength sensor measures the characteristic magnetic field strength $B_{ref}$ when the measured magnetic field strength value differs by less than 10 percent from the characteristic magnetic field strength $B_{ref}$.

7. The method of claim 1, wherein the mobile device also includes an orientation sensor in predetermined alignment with the magnetic field strength sensor, wherein the orientation sensor is configured to ascertain a relative alignment to the B0 field magnet, and wherein the method further comprises:

ascertaining a relative alignment of the magnetic field strength sensor to the B0 field magnet using the orientation sensor; and ascertaining an x-y coordinate pair as a function of the selected $B_{xy}$-z curve, the ascertained z-coordinate, and the ascertained relative alignment.

8. The method of claim 1, wherein the B0-field magnet encloses a patient tunnel, and the reference z-coordinate $z_{ref}$ is arranged with regard to the z-coordinate axis outside the patient tunnel.

9. The method of claim 1, wherein the mobile device is a local coil.

10. The method of claim 1, wherein the mobile device includes a shim coil, and wherein the method further comprises setting a current through the shim coil as a function of a magnetic field strength value recorded by the magnetic field strength sensor.

11. The method of claim 1, further comprising correcting a my-Map in MR-PET as a function of a magnetic field strength value recorded by the magnetic field strength sensor.

12. A local coil positionable relative to a B0 field magnet along a z-coordinate axis that is defined by a symmetry axis of the B0 field magnet in a preferred direction of a B0 field, the local coil:

a magnetic field strength sensor and an orientation sensor that are arranged in a fixed relative position on the local coil, wherein the magnetic field strength sensor is configured to record an amount and a direction of a magnetic field vector, wherein the orientation sensor is configured to record a relative alignment of the orientation sensor to a predetermined spatial direction, and wherein the local coil is in communication with a controller configured to ascertain a relative alignment of the magnetic field strength sensor with the B0 field magnet using the orientation sensor and ascertain an x-y coordinate pair as a function of a selected $B_{xy}$-z curve, a ascertained z-coordinate, and the ascertained relative alignment.

13. A shim coil positionable relative to a B0 field magnet along a z-coordinate axis that is defined by a symmetry axis of the B0 field magnet in a preferred direction of a B0 field, the shim coil comprising:

a magnetic field strength sensor and an orientation sensor that are arranged in a fixed relative position on the shim coil, wherein the magnetic field strength sensor is configured to record an amount and a direction of a magnetic field vector, wherein the orientation sensor is configured to record a relative alignment of the orientation sensor to a predetermined spatial direction, and wherein the shim coil is in communication with a controller configured to ascertain a relative alignment of the magnetic field strength sensor with the B0 field magnet using the orientation sensor and ascertain an x-y coordinate pair as a function of a selected $B_{xy}$-z curve, a ascertained z-coordinate, and the ascertained relative alignment.

14. A magnetic resonance tomography unit comprising:
a B0 field magnet;
a device;
a mobile patient couch;
a controller; and
a storage unit, wherein a magnetic field strength sensor is arranged on the device that is in signal connection with the controller, wherein the patient couch is configured, parallel to a z-coordinate axis that is defined by a symmetry axis of the B0 field magnet in a preferred direction of a B0 field, to be moved into a scanning area of the B0 field magnet by the controller, wherein a characteristic magnetic field strength $B_{ref}$ of the B0 field magnet in a range of between 20% and 80% of magnetic field strength of the B0 field magnet at an isocenter is stored in the storage unit, and wherein the controller is configured to determine a reference z-coordinate $z_{ref}$ by moving the patient couch with the device parallel to the z-coordinate axis relative to the B0 field magnet and magnetic field strength values being recorded by the magnetic field strength sensor via a signal line and compared with the characteristic magnetic field strength $B_{ref}$ until a difference between the recorded magnetic field strength values and the characteristic magnetic field strength $B_{ref}$ is smaller than a predetermined tolerance value, wherein the controller is also configured to provide $B_{xy}$-z curves of a dependence of the magnetic field strength on the z-coordinate for a majority of x-y coordinate pairs, wherein the x-y coordinate pairs indicate points at different distances from the z-coordinate axis, and wherein the controller is configured to:
    record magnetic field strength values by the magnetic field strength sensor for different positions along the z-coordinate axis with constant x-y coordinates;
    select a $B_{xy}$-z curve with the aid of the ascertained magnetic field strength values using an error minimization method; and
    determine a z-coordinate using the selected $B_{xy}$-z curve and a measured magnetic field strength value.

15. The magnetic resonance tomography unit of claim 14, wherein the device also includes an orientation sensor in predetermined alignment with the magnetic field strength sensor, wherein the orientation sensor is configured to ascertain a relative alignment with the B0 field magnet, and wherein the controller is configured to:
    ascertain a relative alignment of the magnetic field strength sensor with the B0 field magnet using the orientation sensor; and
    ascertain an x-y coordinate pair as a function of the selected $B_{xy}$-z curve, the ascertained z-coordinate, and the ascertained relative alignment.

16. A method for determining a position of a mobile device relative to a B0 field magnet along a z-coordinate axis that is defined by a symmetry axis of the B0 field magnet in a preferred direction of a B0 field, by a magnetic field strength sensor arranged in a fixed relative position on the mobile device, the method comprising:
    ascertaining a characteristic magnetic field strength $B_{ref}$ of the B0 field magnet that emerges for a plurality of x-y coordinate pairs at different distances from the z-coordinate axis having essentially a same reference z-coordinate $z_{ref}$, wherein the characteristic magnetic field strength $B_{ref}$ lies in a range of between 20% and 80% of a magnetic field strength of the B0 field magnet at an isocenter;
    moving the mobile device along the z-coordinate axis until the magnetic field strength sensor measures a value of the magnetic field strength sensor differing by less than a predetermined tolerance value from the characteristic magnetic field strength $B_{ref}$.

\* \* \* \* \*

UNITED STATES PATENT AND TRADEMARK OFFICE
CERTIFICATE OF CORRECTION

PATENT NO. : 10,393,829 B2  
APPLICATION NO. : 15/445276  
DATED : August 27, 2019  
INVENTOR(S) : Klaus Ludwig et al.

Page 1 of 1

It is certified that error appears in the above-identified patent and that said Letters Patent is hereby corrected as shown below:

In the Claims

Column 12, (Claim 1; Line 67):
"z-coordinate $z_f$, wherein the characteristic magnetic field"
Should be replaced with:
"z-coordinate $z_{ref}$, wherein the characteristic magnetic field"

Signed and Sealed this
Twenty-fifth Day of August, 2020

Andrei Iancu
*Director of the United States Patent and Trademark Office*